United States Patent
Reddy et al.

(10) Patent No.: US 6,460,166 B1
(45) Date of Patent: *Oct. 1, 2002

(54) SYSTEM AND METHOD FOR RESTRUCTURING OF LOGIC CIRCUITRY

(75) Inventors: Lakshmi Narasimha Reddy, Valhalla, NY (US); Thomas Edward Rosser, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/213,322

(22) Filed: Dec. 16, 1998

(51) Int. Cl.$^7$ .............................................. G06F 17/50
(52) U.S. Cl. ................................. 716/2; 716/3; 716/6
(58) Field of Search .................................. 716/2, 3, 6

(56) References Cited

U.S. PATENT DOCUMENTS

| | | | |
|---|---|---|---|
| 5,003,487 A | 3/1991 | Drumm et al. | 364/489 |
| 5,208,759 A | 5/1993 | Wong | 364/468 |
| 5,222,031 A | 6/1993 | Kaida | 364/489 |
| 5,237,514 A | 8/1993 | Curtin | 364/490 |
| 5,251,147 A | 10/1993 | Finnerty | 364/490 |
| 5,349,536 A | 9/1994 | Ashtaputre et al. | 364/491 |
| 5,396,435 A | 3/1995 | Ginetti | 364/489 |
| 5,397,749 A | 3/1995 | Igarashi | 437/250 |
| 5,461,576 A | 10/1995 | Tsay et al. | 364/490 |
| 5,508,937 A | 4/1996 | Abato et al. | 364/489 |
| 5,526,276 A | 6/1996 | Cox et al. | 364/489 |
| 5,544,071 A | 8/1996 | Keren et al. | 364/489 |
| 5,550,748 A | 8/1996 | Xiong | 364/488 |
| 5,553,000 A | 9/1996 | Dey et al. | 364/488 |
| 5,555,188 A | 9/1996 | Chakradhar | 364/490 |
| 5,638,380 A | 6/1997 | De | 371/22.3 |
| 5,787,010 A * | 7/1998 | Schaefer et al. | 364/489 |
| 5,903,467 A * | 5/1999 | Puri et al. | 364/488 |
| 6,018,621 A * | 1/2000 | Puri et al. | 395/500.02 |
| 6,035,110 A * | 3/2000 | Puri et al. | 395/500.07 |

OTHER PUBLICATIONS

F. Crowet et al., PHIFACT—A Design Space Exploration Program, Proceedings of the European Conference on Design Automation, pp. 55–59, Feb. 1991.*

F. Crowet et al., PHIFACT, A Boolean Preprocessor for Multi–level Synthesis, Nov. 1990 IEEE International Conference on Computer Aided Design, pp. 506–509.*

J. Chung et al., Optimal Buffered Clock Tree Synthesis, IEEE International ASIC Conference and Exhibit, pp. 130–133, Sep. 1994.*

R. Puri et al., Logic Optimization by Output Phase Assignment in Dynamic Logic Synthesis, Nov. 1996 IEEE/ACM International Conference on Computer–Aided Design, pp. 2–8.*

"Logic Optimization and Mapping to Arbitrary N–Input Functions under Constraints", *IBM Technical Disclosure Bulletin*, vol. 33, No. 5, Oct. 1990, pp. 303–306.

"Techniques for Improving Multi–Partitioning Algorithm", *IBM Technical Disclosure Bulletin*, vol. 36 No. 1, Jan. 1993, pp. 473–477.

"Partitioning Logic on to Graph Structures", *IBM Technical Disclosure Bulletin*, vol. 32, No. 9A, Feb. 1990, pp. 469–475.

"Algorithm for Incremental Timing Analysis", *IBM Technical Disclosure Bulletin*, vol. 38, No. 01, Jan. 1995, pp. 27–34.

\* cited by examiner

*Primary Examiner*—Vuthe Siek
*Assistant Examiner*—A. M. Thompson
(74) *Attorney, Agent, or Firm*—Kelly K. Kordzik; Winstead Sechrest & Minick P.C.; Anthony V. S. England (57) ABSTRACT

An algorithm for efficient restructuring of logic circuitry to improve selected characteristics (delay and/or area). Along a path through the logic circuitry, the logic is converted to equivalent implementations with the same Boolean function using specific choices from the library of available cells, such that these conversions provide an improvement in the cost/benefit for the selected characteristics.

8 Claims, 10 Drawing Sheets

Fixed Bonus

| Book | Group | Original Benefit | Bonus | New Benefit |
|---|---|---|---|---|
| Book 1 | 1 | 100 | 50 | 150 |
| Book 2 | 1 | 50 | 50 | 100 |
| Book 3 | 2 | 70 | 20 | 90 |
| Book 4 | 2 | 40 | 20 | 60 |
| Book 5 | 3 | 40 | 0 | 40 |
| Book 6 | 3 | 20 | 0 | 20 |

FIG. 15

Percentage Bonus

| Book | Group | Original Benefit | Bonus | New Benefit |
|---|---|---|---|---|
| Book 1 | 1 | 100 | 50% | 150 |
| Book 2 | 1 | 50 | 50% | 75 |
| Book 3 | 2 | 70 | 20% | 84 |
| Book 4 | 2 | 60 | 20% | 48 |
| Book 5 | 3 | 40 | 0 | 40 |
| Book 6 | 3 | 20 | 0 | 20 |

FIG. 16

SYSTEM AND METHOD FOR RESTRUCTURING OF LOGIC CIRCUITRY

CROSS-REFERENCE

The present application is related to the following co-pending patent applications:

U.S. patent application Ser. No. 09/213,320, issued as U.S. Pat. No. 6,282,695;

U.S. patent application Ser. No. 08/761,891, entitled "identifying An Optimizable Logic Region In A Logic Network";

U.S. patent application Ser. No. 08/763,980, entitled "Selecting Phase Assignments For Candidate Nodes In A Logic Network"; and U.S. patent application Ser. No. 08/761,890, entitled "Identifying Candidate Nodes for Phase Assignment In A Logic Network," which are hereby incorporated by reference herein.

TECHNICAL FIELD

This invention relates generally to digital logic, and more specifically, to a network of logic gates, such as dynamic logic gates.

BACKGROUND INFORMATION

Figure 1:
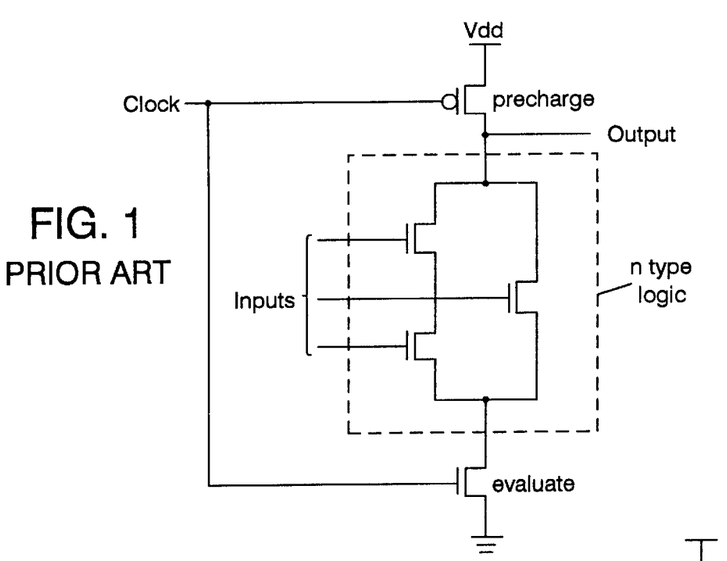
FIGS. 1 and 2 illustrate prior art dynamic logic circuitry.

The use of dynamic logic is an efficient way of increasing circuit speed and reducing die area of integrated circuitry. The basic dynamic gate, shown in FIG. 1, includes a logic structure whose output node is precharged to VDD by a P-type transistor (the "precharge" transistor) and conditionally discharged to ground by an N-type transistor (the "evaluate" transistor). The precharge and evaluate transistors are typically connected to a single phase clock. During the precharge phase, the clock is low and the output node is precharged to VDD. At the completion of the precharge phase, the clock goes high and the path to VDD is turned off while the path to ground is conditionally turned on. In this evaluate phase, depending on the state of the data inputs, the (output will either be at a high level or will be pulled down.

Figure 2:
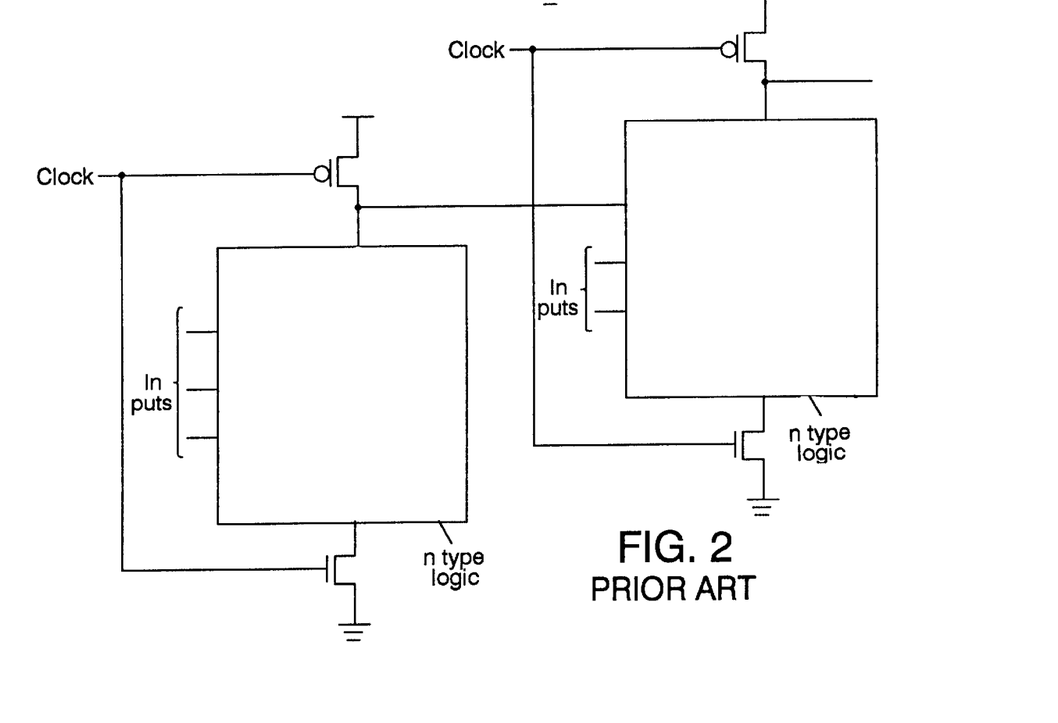

This dynamic logic is advantageous in that it generally requires fewer transistors than static logic. These circuits are often cascaded as shown in FIG. 2. However, when many of these circuits are cascaded, delays in propagating the signal through the cascaded blocks can mount.

Figure 3:
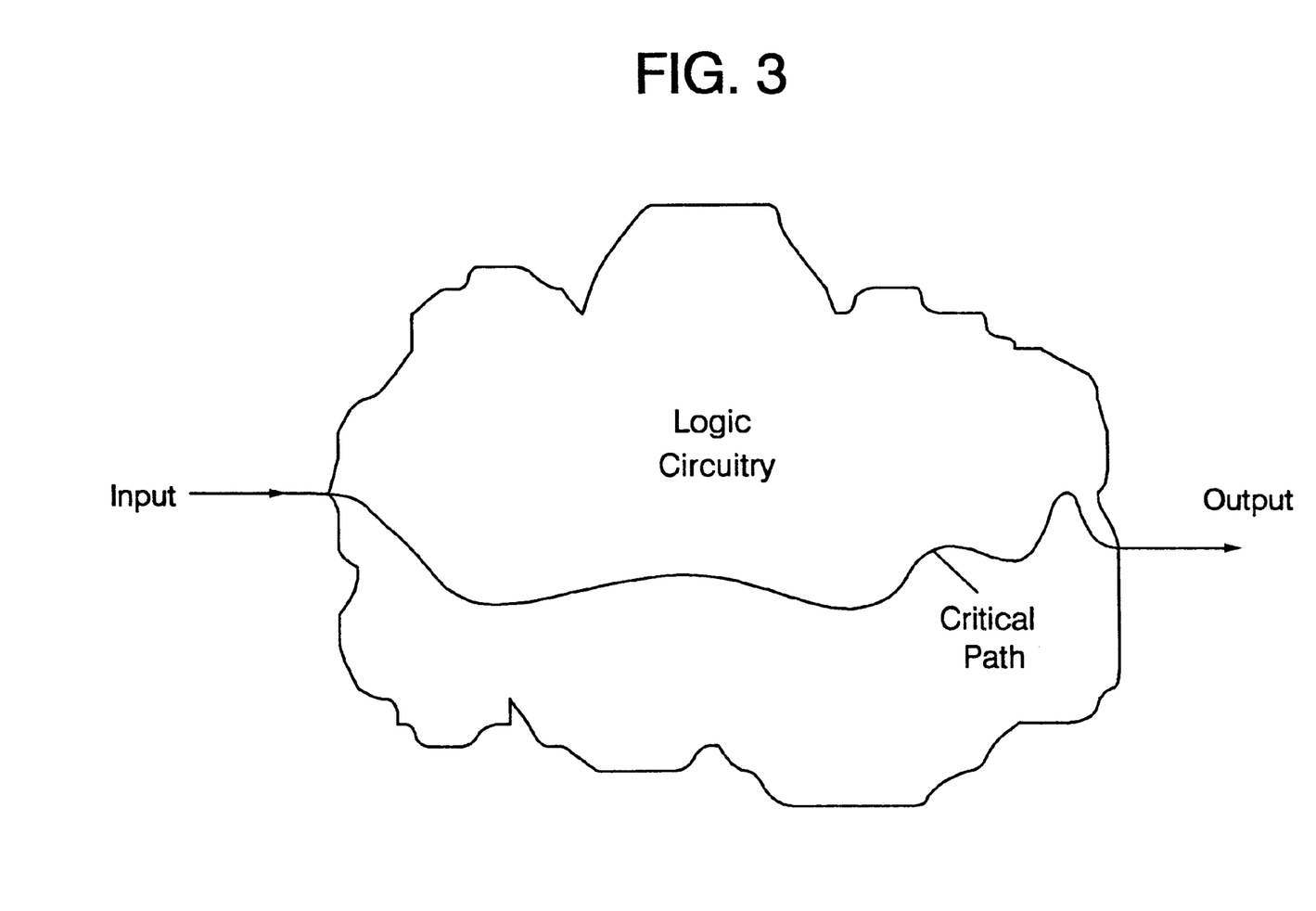
FIG. 3 illustrates a critical path within a sea of logic circuitry.

Referring next to FIG. 3, there is illustrated a sea of logic circuitry having an input and an output, which may be implemented within a portion of a data processing system. Such logic circuitry can be represented by a sea of Boolean equations. Within the sea of logic circuitry, there is a critical path, which for a particular set of designated criteria results in the highest cost for that designated criteria. Quite typically, the primary criteria with which a designer is concerned is the amount of time it takes for a signal to travel from the input to the output. The critical path within the logic circuitry is the path requiring the longest amount of time for the traveling of such a signal. Naturally, other criteria may be utilized such as circuit costs or area.

Nevertheless, it is often desired to minimize the timing required for such a sea of logic circuitry. One of the most fruitful techniques for doing so is to redesign the circuitry along the critical path in order to shorten the amount of time it takes for a signal to travel from the input to the output over such a critical path. Of course, once an identified critical path has been redesigned, another critical path within the sea of logic circuitry may be established.

What is needed in the art is an efficient and flexible system and method for restructuring logic circuitry in order to minimize a particular cost criteria, such as the amount of time it takes for a signal to travel through a particular path within the logic circuitry.

SUMMARY OF THE INVENTION

The present invention utilizes a process of building dynamic AO (AND/OR) and OA (OR/AND) books using a weighted cost function that results in a basic greedy algorithm. The greed of the algorithm is controlled such that the current critical path and any logic that is near critical will be processed first. This allows the "best" choice of building a specific block (e.g., an AND block) into an OA with the ORs that feed it or into an AO for the OR that it feeds.

The aggressive gathering and splitting of AND and OR sections of logic, combined with the selection of the pin subset to use in forming AO and OA books results in a relatively high percentage of these books being used.

Factors in the cost benefit of building a particular book are the delay cost weight, area cost weight, estimated delay, estimated area, ratio of time to area, change in slack, change in number of blocks, and average slack improvement seen by involved paths. Any block that is within a threshold (e.g., fixed amount of time, or slack) of the critical path is examined against a set of available patterns to see if there is a positive benefit in building an AO or OA.

The books available in the target technology are summarized into internal tables, allowing a very fast and efficient test of patterns performing AO and OA books. The number of ports (first stage logic function in a complex book, e.g., the AND function of an AO) and pins available in each port can be queried by the code to reject patterns that cannot be directly mapped to an available technology book.

In addition, the delay and area of each type of book is gathered. The timing tool is modified to use technology estimates that are sensitive to the number of pins on the logic function. These estimates are either derived from the default delay of the default power level at a specific capacitive load (when the book can be directly mapped) or derived from a formula that estimates what delay in area would be achieved later when the book is factored and repowered to meet technology limits (e.g., a 64-input AND is not directly implementable but can still be estimated by the formula to be much slower than a 16-input AND, while the estimation for a 4-input AND is derived from the actual timing rules for a technology AND book).

Every block in the selected section of logic (paths that are within a threshold of the current worst path) is examined to see if any logic restructuring to form AO or OA books can be performed. If any pattern is found acceptable (positive benefit as viewed by the cost function) it is considered. After all available patterns at this point are examined, only the pattern with the best benefit (at this block) is kept. It is added to a list for selecting the best overall pattern(s) to actually form. When all selected blocks have been examined, the list of restructuring points is sorted by the cost function score, with the best improvement first. As in any greedy algorithm, all previous choices are kept. However, with this aggressive approach, previous decisions are examined for additional benefit (adding/swapping pins on parts, adding/removing parts, etc.).

The processing of the list can have different levels of "aggressiveness" (high, medium, and low), controlling how patterns that overlap are handled. A high aggressiveness only processes the first entry and then rebuilds the entire list.

This is the most accurate for selecting blocks on the "best" critical path (allowing it to move as a result of building this AO or OA), but does not generally give better results than the medium aggressiveness level and consumes a significant amount of CPU time.

The medium aggressiveness level processes the list until it finds an item on the list that no longer exists or for which the benefit has gone below the predicted benefit (when the list was built and sorted). This item was a place where a block was involved in more than one pattern and some higher benefit pattern absorbed a required block (pattern overlap) or which used to be on the critical path but is not now due to some other higher benefit pattern.

The low aggressiveness level merely skips pattern overlap till the end of the sorted list, requiring the least amount of CPU time in rebuilding lists.

The list is rebuilt if the aggressiveness level is set to HIGH or MEDIUM and the list processing was exited prior to reaching the end of the list (pattern overlap). When the normal end of list is encountered, the algorithm checks the current worst critical path against the stored slack for the worst critical path prior to the restructuring. If the worst slack is improved by at least some specified amount, then the process is repeated. Pre- and post-blocks (remnants of splitting a block, e.g., 4 pins were available but the port only accepts 2 pins) formed by one pattern may create additional opportunities to other patterns.

After the algorithm exits, the terms in the cost function and the threshold that control which logic to process can be modified to form more AO and OA books farther and farther off the critical path until all the logic has been processed. This naturally puts the most effort into speeding the critical paths without ignoring the savings that may occur in the non-critical logic.

The use of dynamic logic and the formation of OA and AO blocks are for illustration only and not intended to be a limitation on the applicability of the present invention to other logic types.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

A "book" refers herein to an identifiable primitive. function (i.e., "cell"). This includes a pre-designed circuit for performing a certain Boolean function, together with certain information about the circuit.

The invention relates to a design automation system which has libraries of these books for use in building circuits. The invention concerns certain aspects of a method for restructuring, i.e., transforming, specified logic functions to match the structure of available books. This restructuring is also referred to as "forming a book."

Figures 5, 6:
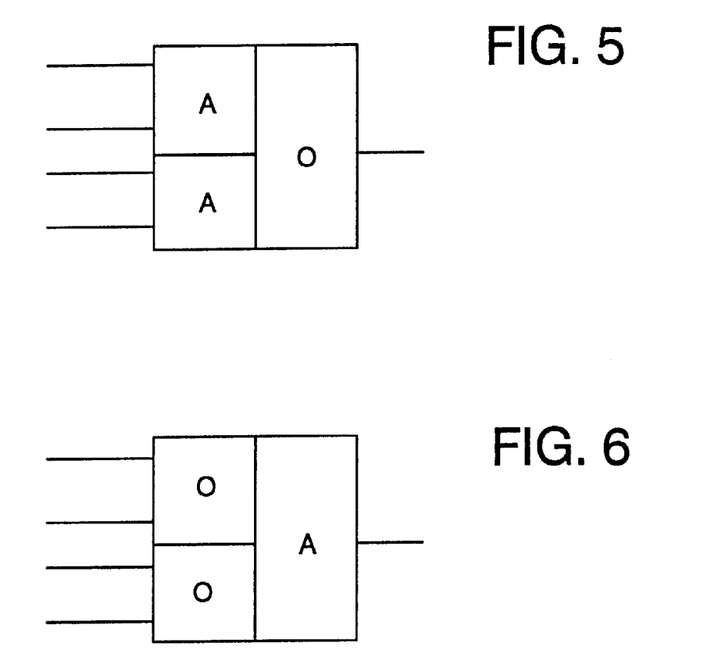
FIG. 5 illustrates an AO book.
FIG. 6 illustrates and OA book.

A two-stage book means the book performs a two-layer Boolean function; for example, the Boolean function (referred to as an "AO" book): (a AND b) OR (c AND d) OR (e AND f). Note, this can be represented as (a•b)+(c•d)+(e•f). An AO book is illustrated in FIG. 5. An "OA" book means a function such as: (a OR b) AND (c OR d) AND (e OR f). FIG. 6 illustrates an OA book.

This disclosure refers to "cost functions." Consider that a circuit has certain characteristics such as area, delay, interconnect complexity and number of books. The present invention includes computing the "cost" of circuits according to a cost function which applies a predetermined weighting to. changes of each of these characteristics to the circuits. The present invention also concerns further analyzing the transformations in order to decide which transformation to select.

The transformations of the present invention are applied to circuitry performing Boolean logic functions which are as much as 60 to 80 levels deep. This optimization is quite difficult.

The main factor for optimization is speed (i.e., minimize delay for a circuit), since the method of the invention was developed for applying to dynamic control logic. That is, circuitry area and speed are the main trade offs in circuit design. Circuitry for control logic is only a relatively small portion of microprocessor circuitry. Therefore, speed is the main objective for control logic circuitry.

However, the present invention is not limited to use with dynamic logic or any other "family" of logic, nor is the present invention limited to use in control logic.

Any design has a critical path through the circuit (or implementation) which governs the design's worst case speed. In a circuit which performs logic that is 60 to 80 levels deep, it is difficult to identify a single most critical path. It is not practical to simulate every possible design possibility. The present invention therefore includes making a succession of transformation choices, wherein each transformation depends on the circuit which results from a preceding transformation. The method includes analyzing, after each transformation, delay through a number of paths in the circuitry. The various paths are then classified into groups according to ranges of delays. One of the issues of the present invention concerns how much to favor particular groups in choosing each succeeding transformation.

For applications of the present invention to domino dynamic logic, a given static or noncascaded dynamic logic function must first be converted to such domino logic. Thus, prior to identifying a critical timing path and restructuring logic according to the present invention to reduce the input to output time for the logic, conversion to domino logic must be performed. In connection with converting to logic, it is advantageous to convert the logic net to AND, OR and NOT gates whenever the NOT gates are located solely at the boundaries of the net, as is described in the above-referenced patent applications: Ser. No. 08/761,891, Ser. No. 08/763, 980, and Ser. No. 08/761,890. The resultant logic is a sea of AND and OR gates. An example of a portion of such a sea of AND and OR gates is illustrated in FIG. 4.

Since stacked P-type devices are much slower than N-type devices, it is desirable to maximize the size of the N-tree within certain technology limits. By adding just a few transistors, the function enabled within the N-tree can be dramatically modified. Nevertheless, by adding the transistors, very different Boolean functions can be achieved, and instead of having two or three levels of logic, a particular set of Boolean functions can be compacted into one level of logic that runs much faster. This is the idea behind forming AO and OA blocks.

Figure 4:
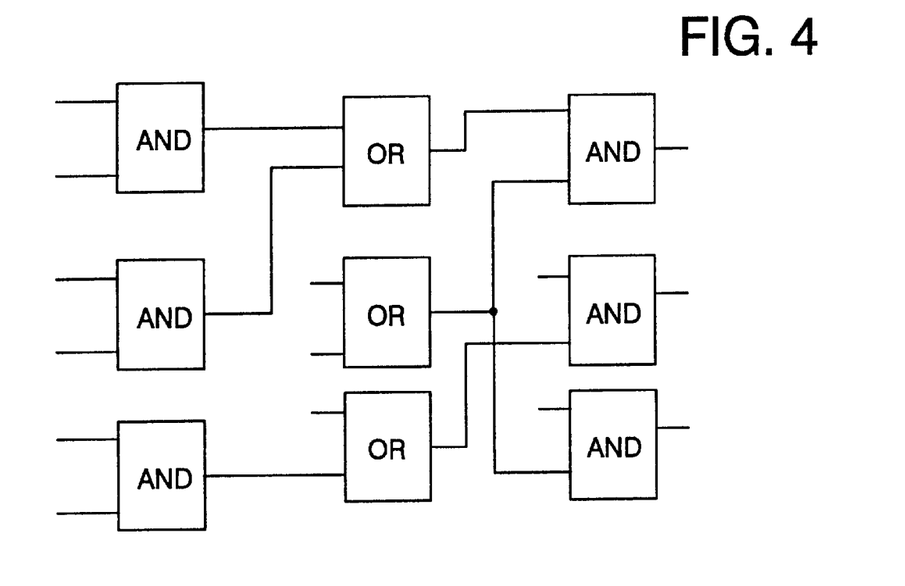
FIG. 4 illustrates an exemplary implementation of interconnected AND and OR gates.

Referring to FIG. 4, one of the issues is to whether form an AO to the left or an OA to the right. Often, the answer is the choice that makes the circuit go the fastest overall. Therefore, optimization involves both the consolidation of several layers of logic into one AO or OA block, but also determining the correct location for such an AO or OA block. Depending upon the location of the critical path through a set of logic levels, different patterns can be chosen, all performing the same overall Boolean function.

Figure 7:
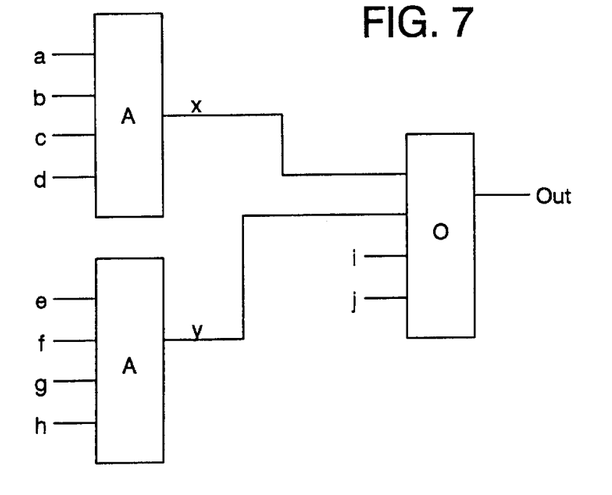
FIGS. 7–10 illustrate exemplary substitutions (patterns) enabled using the present invention.

For example, refer to the original logic pattern shown in FIG. 7. Inputs a, b, c, and d are ANDed together and are being ORed with another large AND term, e, f, g, and h. Additionally, i and j are left over and have to be accounted for.

Figure 8:
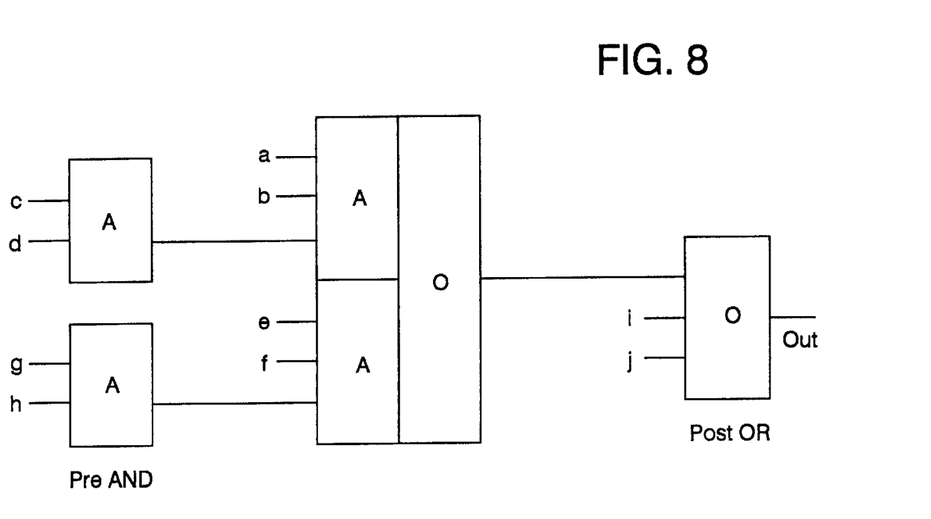

FIG. 8 shows that pre-ports and post-blocks can be allowed. There is a pre-AND of inputs c and d and a pre-AND of inputs g and h, then there is a post-OR of i and j with the output of the AO block.

Figure 9:
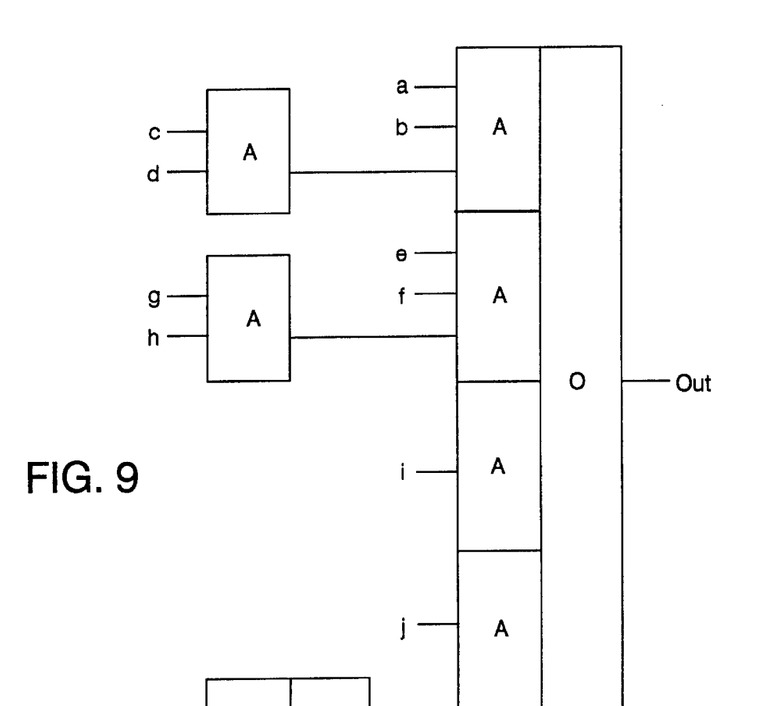
Figure 10:
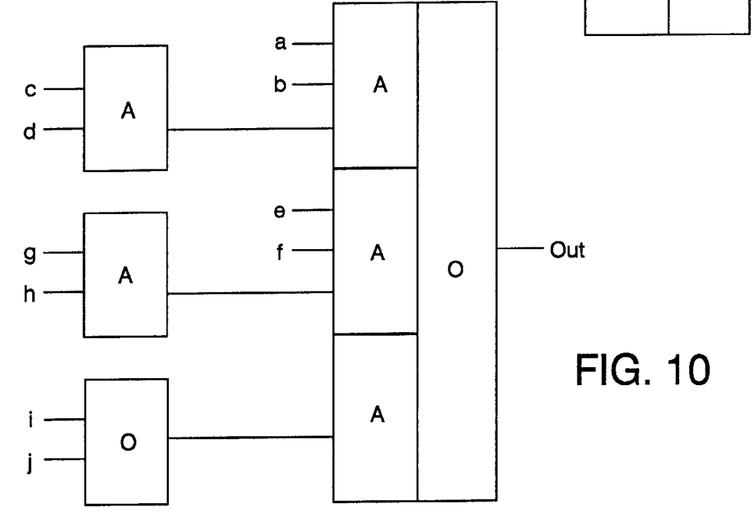

FIG. 9 illustrates another pattern having the same Boolean function, which moves i and j from a post-block to an earlier logic level. A one-input AND is essentially a pass-through. In this pattern, input a now only passes through one block, so the passage of input a has been accelerated. Additionally, input c now goes through two blocks, but it essentially has not been penalized. However, now i and j go through a block which is somewhat slower than it used to be, since bigger blocks are a little slower. So therefore i and j were penalized. And depending on the natural timing of the circuit, i.e., where the critical path arises, one can favor changing the pattern to obtain better timing results. For example, the pattern illustrated in FIG. 10 pre-ORs i and j and then provides a pass-through with the one-input AND in the AO block. This improves the timing slightly, since it reduces the size of the book.

The changing of the patterns as illustrated in FIGS. 7–10 illustrate what a custom logic designer would do when trying to find the right pattern in order to minimize the critical path. This is essentially what the present invention accomplishes. The present invention searches the critical path for various patterns that match logic patterns, utilizing AO and OA books, within a library. As an example, such a library for the pattern illustrated in FIG. 7 may include the patterns illustrated in FIGS. 8–10. Any one of the patterns in FIGS. 8–10 may be substituted for the original logic pattern in FIG. 7 as a function of the location of the critical path through the original logic pattern. Other patterns can be managed in a similar manner.

Furthermore, as will be discussed herein, different patterns can be weighted differently according to various criteria, such as transmission delay, area, manufacturing costs, etc. This weighted cost function is then utilized to determine which pattern should be substituted in order to minimize the cost function.

Figure 11:
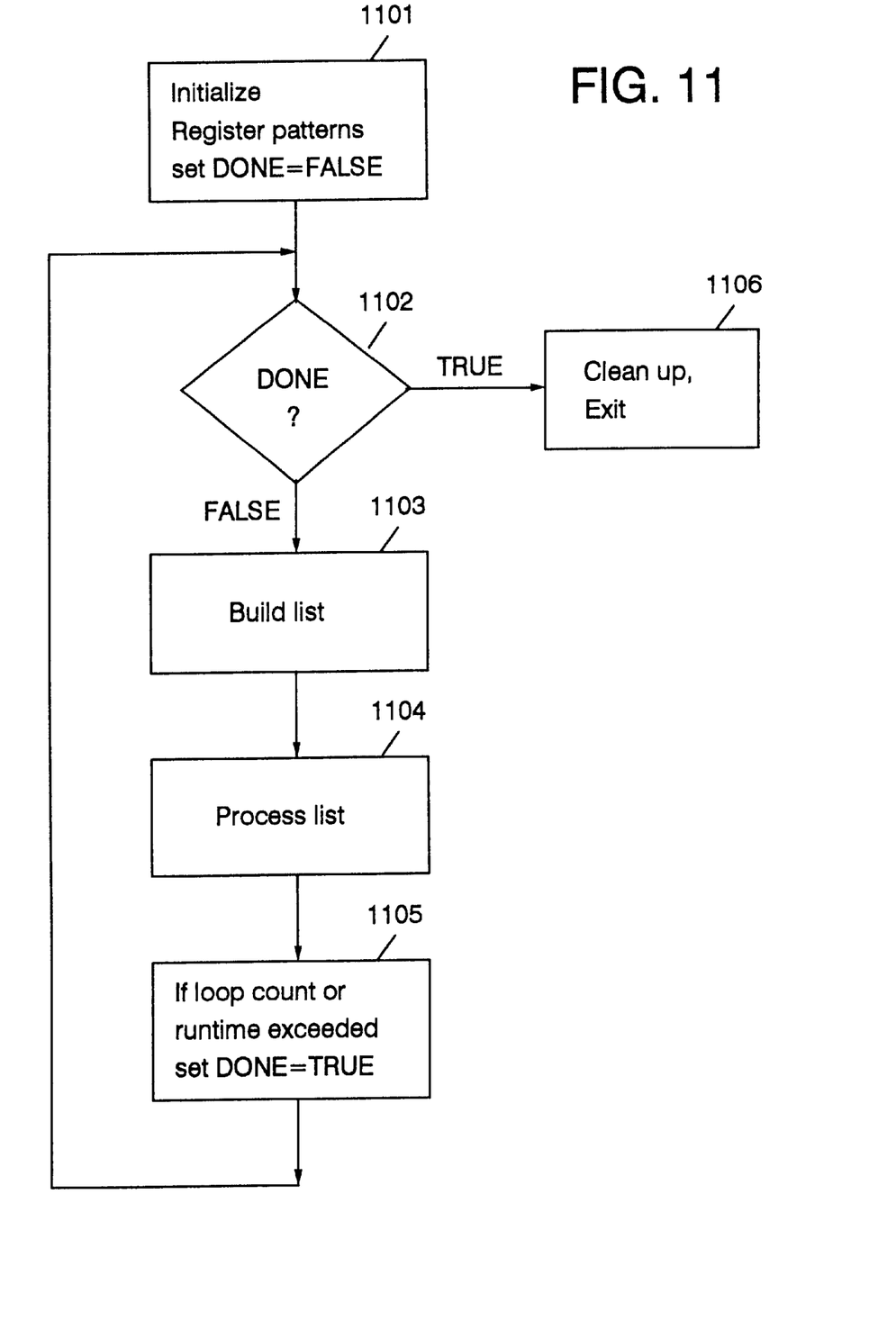
FIGS. 11–13 illustrate a process implemented in accordance with the present invention.

The process of the present invention is now described with respect to the flow diagram illustrated in FIG. 11. In step 1101, there is an initialization stage whereby there is a merging of the large cones of ANDs into a single AND. In other words, the cone is an AND of every input and could be built with one large AND block. This allows the process to sort the inputs by their criticality and just deal with the first few inputs which are most critical without changing the cone of logic. Furthermore, in step 1101, the various patterns within the library are registered. The registration of the books within the algorithm helps save time by categorizing the various pattern blocks as to what type of blocks do they match (e.g., AND blocks, AO blocks). While processing the logic, the blocks in the library are then searched for matches with books within the logic circuitry. Only registered patterns will be called for a particular instance of a block type in the model, saving CPU time. Each pattern can deal with an arbitrarily sized library book (e.g., an AO with 3 groups of 3 inputs, another with 1 group of 4 inputs, and 2 groups of 2 inputs, etc.).

Next, in step 1102, since DONE is equal to FALSE, the process proceeds to step 1103 to begin building the list. Essentially, the patterns in the library are compared to the target logic circuitry and a list of all possible substitutions is performed. For each substitution, there will be a cost function associated therewith, which will assist in analyzing which substitutions are best. Only patterns with a positive benefit are kept. The list of all possible patterns is then sorted by benefit, and any patterns requiring the same logic block are eliminated (keeping the pattern with better benefit).

Figure 12:
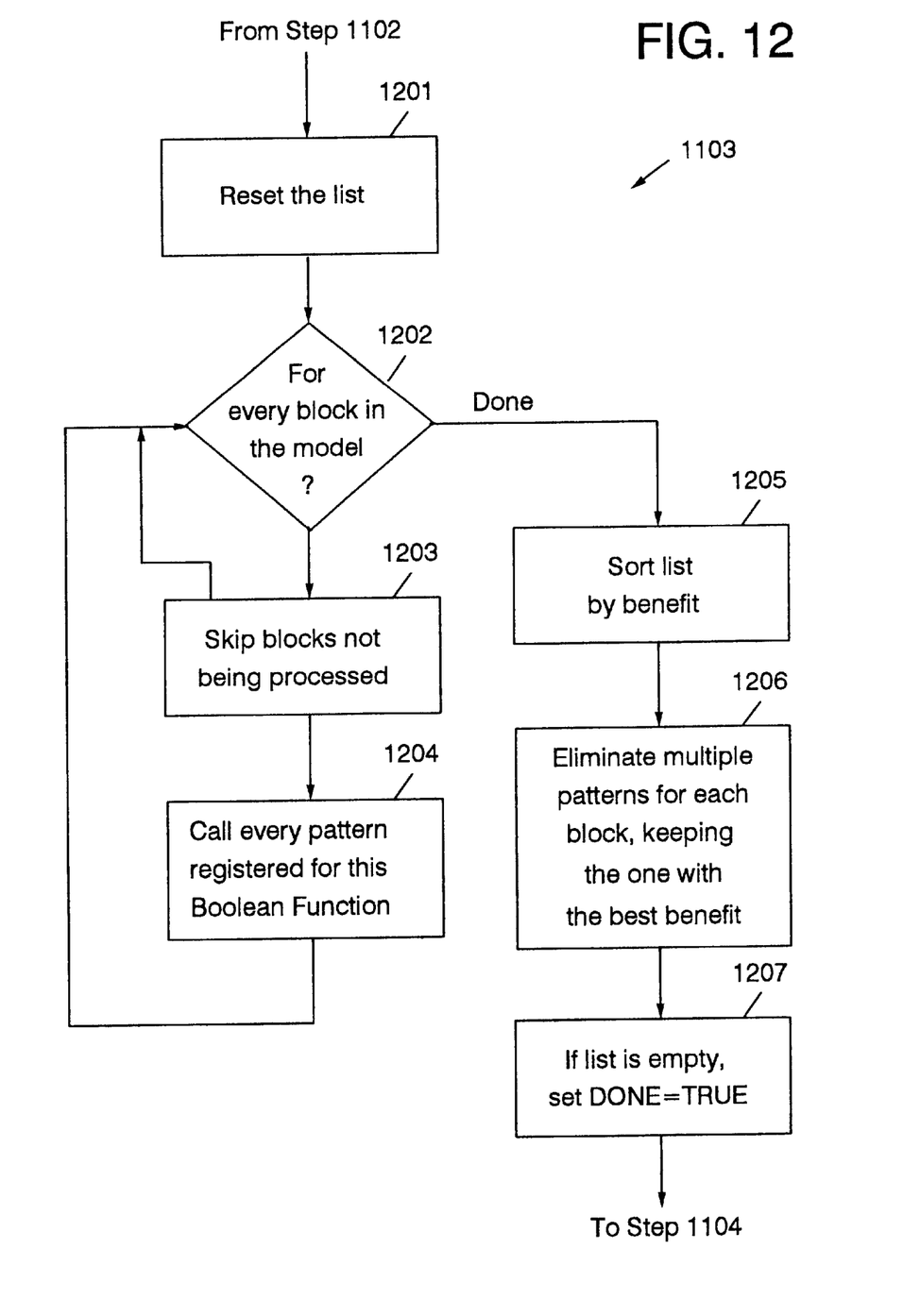

Step 1103 is further detailed in FIG. 12. In step 1201, any previous entries on the list of possible patterns are discarded and the list is reset (emptied and initialized). Then, in step 1202, the entire design is searched for every block in the model that needs to be processed. These blocks must be on (or near) the current critical path, must be of a type for which patterns have registered, and must be free of any designer constraints that prevent them from being changed. Each block that meets these requirements is passed to every pattern registered for this type (AND, AO, etc.) of block. Each pattern examines the block and its surround logic and predicts what benefit might be achieved by forming a particular pattern. If the predicted benefit is positive, the pattern records the prediction for this block on the list of possible patterns.

After every block in the design has been analyzed, the list is sorted by the amount of benefit predicted by the patterns (step 1205). Obvious duplicates are removed (places where multiple patterns are recorded for the same block instance) to avoid "false" indications of pattern overlap (step 1206). If at this point the list is empty then there is no further work to do, set DONE=TRUE, and the method exits (step 1207). The process then returns to step 1104 in FIG. 11.

Figure 13:
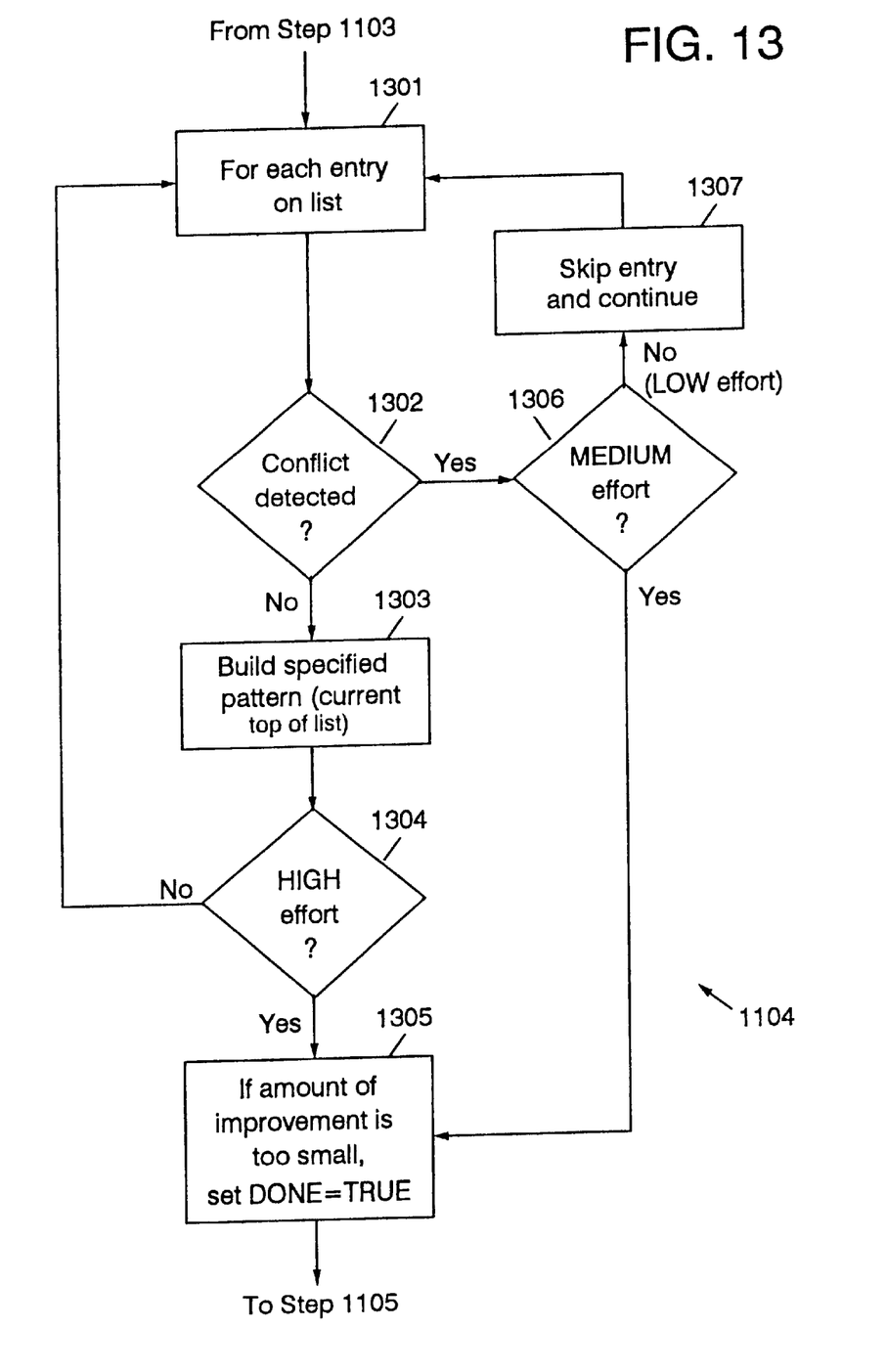

How the list is processed is described in FIG. 13. Processing of the list calls the pattern with the most benefit and then performs the substitution per each entry in the list (step 1301 in FIG. 13). In step 1302, a conflict is detected (the selected pattern is re-invoked to check the predicted benefit) if the cost savings associated with substitution of that pattern is now lower than its original prediction. This can happen when some previous pattern essentially took away some of the benefit associated with the present pattern by modifying some of the logic needed by the present pattern. If the registered block no longer exists, an overlap is also detected. If a conflict is detected, then the process proceeds to step 1306. The overall goal of processing the list of possible patterns is to make the highest number of high benefit changes to the design with the least CPU time. As each change is made (by processing an entry on the top of the list) the accuracy of the benefit predicted by the list decreases. This is a natural effect of changes in path delay from other higher benefit patterns (the current critical path is now "fixed" and some other path has become the most critical) or part or all of a block has been consumed by some other pattern. It is also possible that new opportunities for patterns might arise as the current list of patterns is formed.

Steps 1304 to 1307 show three methods of dealing with the changing environment just described. HIGH effort assumes that only one pattern is to be formed and all others currently on the list are to be discarded. This is the most greedy, most accurate and most costly option, since the large design space must be re-analyzed after every change. If the selected method is HIGH, then the path to step 1305 is taken. The MEDIUM effort method allows formation of all those patterns that do not conflict with each other (require some of the same logic as another pattern) or until the predicted benefit becomes inaccurate (less than what was predicted). The patterns at the top of the sorted list will generally be either along different pieces of a single critical path or at similar spots on a similar critical path. When step 1306 and 1302 are both true, it is time to rebuild the list with the current design information and it goes to step 1305. When conflicts are detected and the effort is LOW, all the remaining list entries are processed, saving significant CPU time at the potential risk of inaccurate predictions. This method is useful when processing areas of logic that are non-critical.

If the changes being made to the logic are not significantly improving the timing, then step 1305 causes the method to exit. The process then proceeds to step 1105 in FIG. 11.

In step 1105, if the loop count (the number of times the list has been built) or run time has been exceeded, then DONE= TRUE is set and the process returns to step 1102. This will cause the process to proceed to step 1106 to the clean-up and exit stage. The clean-up process frees up the tables in the library and reclaims CPU memory that the algorithm exhausted. Furthermore, the new model with the substituted logic is then processed to ensure that there are no illegal conditions. For example, any unconnected input pins are deleted.

If DONE is not equal to TRUE for one of the various reasons specified in steps 1105 and 1305, the process will return to step 1103, which in this case is also step 1201 in FIG. 12 where the list is reset.

If the algorithm is set to reconfigure the logic circuitry using HIGH effort, then every time there is a substitution, the list is then reset and then substitution process repeated. This is because once a substitution is made, it is likely that the critical path has already moved somewhat. HIGH effort dictates that it is very important that it always attack the most critical path, not just the ones that are near it. MEDIUM effort dictates that in general there is going to be a couple of things that can be done along the current critical path which can all be done and will not conflict with each other. In other words, several substitutions can be performed without encountering a conflict. MEDIUM effort is more algorithmically cost effective.

LOW effort ignores conflicts. If a conflict occurs (e.g., logic is stolen by a previously processed pattern), the process under LOW effort will ignore such a conflict. Often, the LOW effort is primarily trying to save silicon area and result in a positive timing effect without particularly caring where the improvement in the timing occurs.

Figure 14:
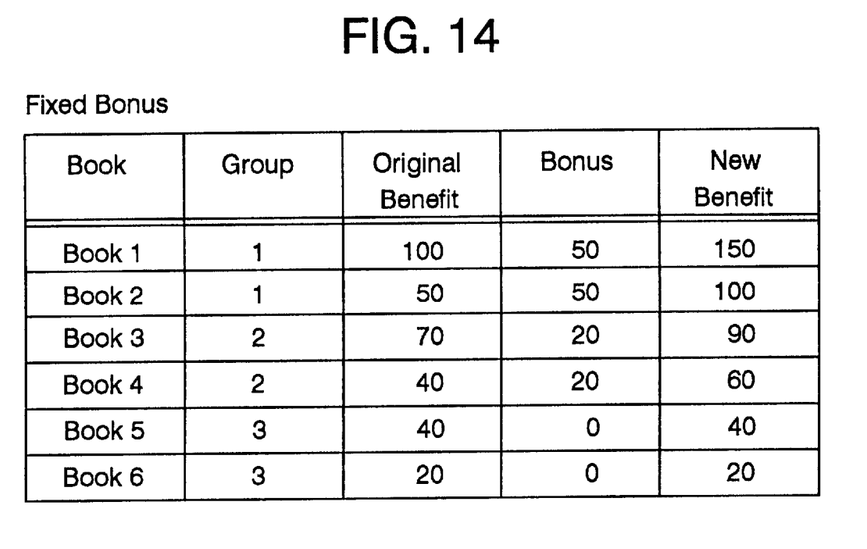
FIGS. 14 and 15 illustrate two examples of implementing a threshold function for possible logic circuit substitutions.
Figure 15:
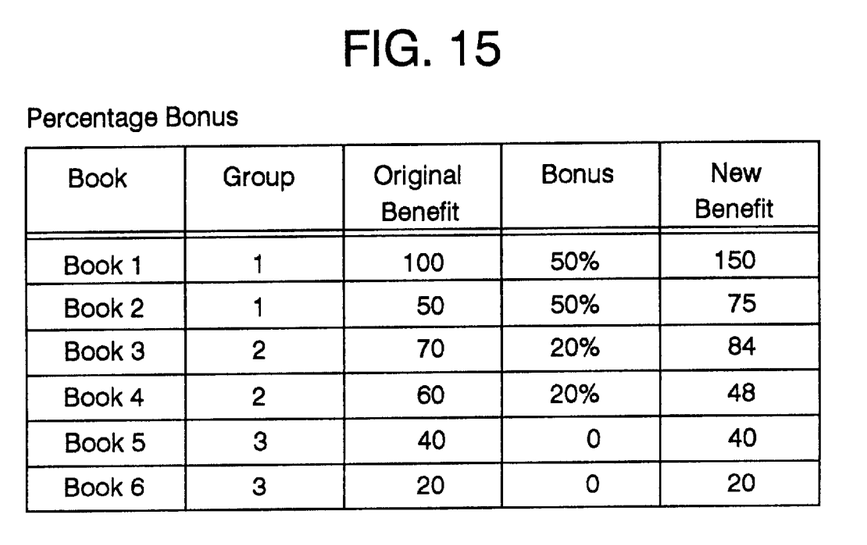

The following description represents a variation of the invention described within U.S. patent application Ser. No. 09/213,320, issued as U.S. Pat. No. 6,282,695, which is hereby incorporated by reference herein. The following works within the framework described previously, yet yields significantly different results in area and timing. This variation achieves this by providing a more global view of the logic network being modified by conceptually (not physically) dividing it into sections of logic that have similar timing characteristics. The number of conceptual divisions is not limited, but will be described as three dimensions (thresholds). Referring to FIGS. 14 and 15, the use of these thresholds to affect the cost function previously described can be done in several ways to achieve a particular goal (timing or area improvement).

FIG. 14 illustrates an example for modifying the cost benefit with a fixed bonus scheme, while FIG. 15 illustrates modifying the cost benefit with a percentage increase bonus scheme. Essentially, because some books to be substituted may have greater cost benefits because of an improvement in the amount of silicon used for the book, or a speed benefit associated with utilization of a particular pattern, the thresholding function can be utilized so that particular patterns have an added cost benefit. This will allow them to be selected within the substitution process when they might otherwise have been skipped in favor of some other pattern.

In FIG. 14, Group 1 may be defined as books that are the most critical in timing (farthest away from meeting the time requirements), while Group 2 is nearly critical (e.g., within 100 picoseconds), and Group 3 is the rest of the logic. The fixed bonus for Book 2 (a critical book) would cause it to be selected for restructure before Book 3 (which used to have a higher benefit of 70). The fixed bonus of 20 points for Group 2 allows Book 4 and Book 5 to be differentiated. Before the bonus, they both had a benefit of 40 while after the bonus is applied, Book 4 has a benefit of 60. This would force the restructuring algorithm to form the pattern at Book 4 prior to (or possibly instead of) forming the pattern at Book 5.

In FIG. 15, the percentage bonus scheme can give different results. While the fixed bonus used in FIG. 14 for Book 2 caused it to be selected over Book 3, this is not true here. The benefit of forming the pattern at Book 3 is still more than the benefit of forming Book 2. The same ordering of Book 4 and Book 5 is achieved, however. This again allows the breaking of ties or near ties between groups with different critical timing characteristics. The amounts of the fixed bonus for each group or the percentage bonus for each group is set heuristically. The final cost/benefit is a function of the weights for each term in the cost equation (area, delay, etc., described earlier), the bounds used to divide the logic into groups, and the bonus amount and method (fixed or percentage) used for each group. (Different methods may be used on a per-group basis.)

Figure 16:
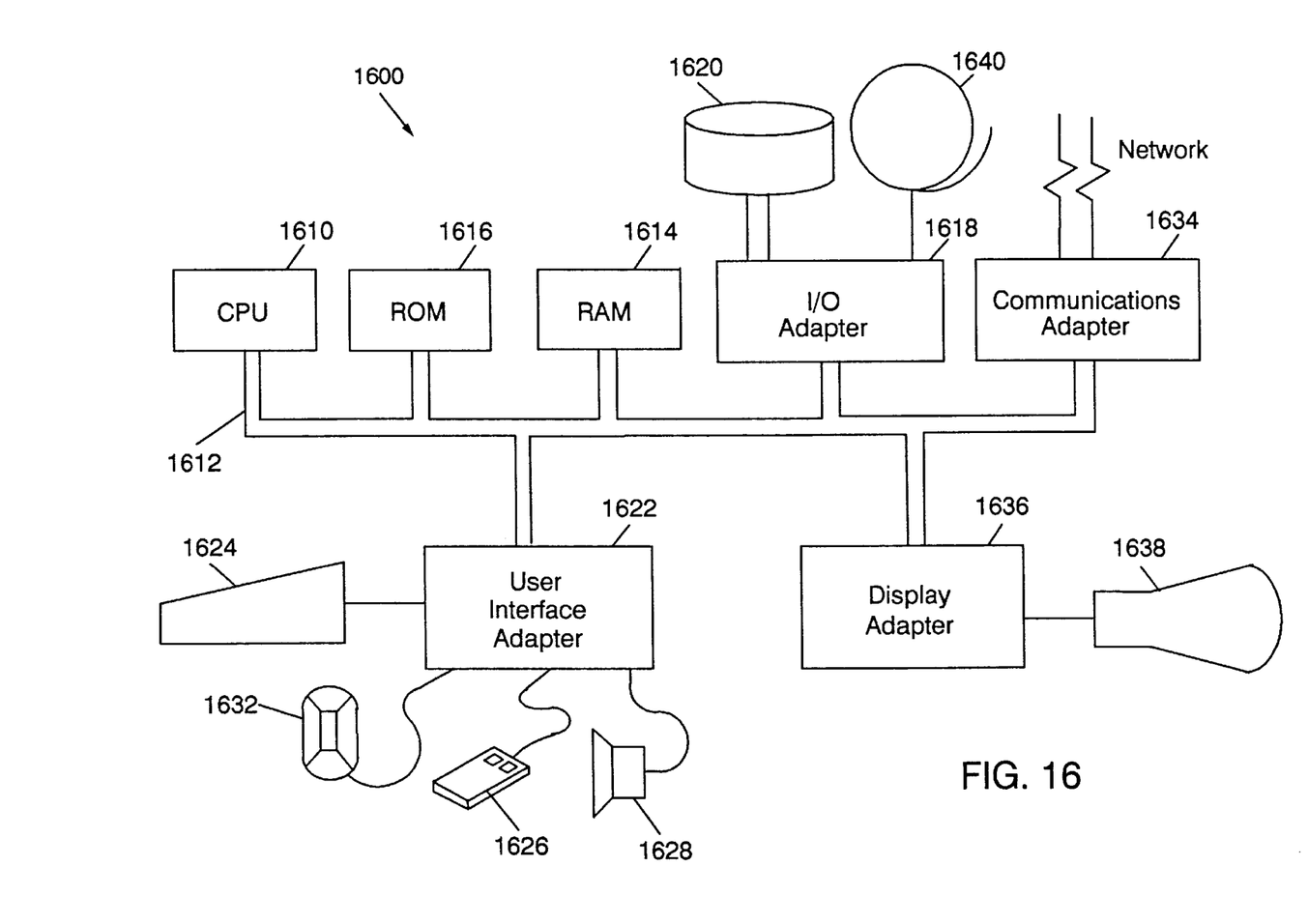
FIG. 16 illustrates a data processing configured in accordance with the present invention.

A representative hardware environment for practicing the process of the present invention (FIG. 11) is depicted in FIG. 16, which illustrates a typical hardware configuration of workstation 1600 in accordance with the subject invention having central processing unit (CPU) 1610, such as a conventional microprocessor, and a number of other units interconnected via system bus 1612. Workstation 1600 includes random access memory (RAM) 1614, read only memory (ROM) 1616, and input/output (I/O) adapter 1618 for connecting peripheral devices such as disk units 1620 and tape drives 1640 to bus 1612, user interface adapter 1622 for connecting keyboard 1624, mouse 1626, speaker 1628, microphone 1632, and/or other user interface devices such as a touch screen device (not shown) to bus 1612, communication adapter 1634 for connecting workstation 1600 to a data processing network, and display adapter 1636 for connecting bus 1612 to display device 1638. CPU 1610 may include other circuitry not shown herein, which will include circuitry commonly found within a microprocessor, e.g., execution unit, bus interface unit, arithmetic logic unit, etc. CPU 1610 may also reside on a single integrated circuit.

Preferred implementations of the invention include implementations as a computer system programmed to execute the method or methods described herein, and as a computer program product. According to the computer system implementation, sets of instructions for executing the method or methods are resident in the random access memory 1614 of one or more computer systems configured generally as described above. Until required by the computer system, the set of instructions may be stored as a computer program product in another computer memory, for example, in disk drive 1620 (which may include a removable memory such as an optical disk or floppy disk for eventual use in the disk drive 1620). Further, the computer program product can also be stored at another computer and transmitted when desired to the user's workstation by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention may describe terms such as comparing, validating, selecting, identifying, or other terms that could be associated with a human operator. However, for at least a number of the operations described herein which form part of at least one of the embodiments, no action by a human operator is desirable. The operations described are, in large part, machine operations processing electrical signals to generate other electrical signals.

Although the present invention and its advantages have been described in detail, it should be understood that various changes, substitutions and alterations can be made herein without departing from the spirit and scope of the invention as defined by the appended claims.

What is claimed is:

1. A computer program product adaptable for storage on a computer storage medium, the computer program product operable for redesigning dynamic logic circuitry, comprising the program steps of:

comparing portions of the logic circuitry to a library of books;

building a list of matches between the portions of the logic circuitry and the library of books;

selecting the matches that provide a specified cost benefit, wherein selected ones of the matches have a higher cost benefit; and removing inverting nodes from the portions of the logic circuitry so that the portions only comprise AND and OR books, wherein the removing program step is performed before the comparing program step.

2. The computer program product as recited in claim 1, wherein each of the portions of the list includes one or more OA and/or AO books from the library.

3. The computer program product as recited in claim 2, wherein the building program step further comprises the program steps of:

for each of the portions, sorting the list by cost benefit, taking into account the higher cost benefit associated with the selected ones of the matches; and for each of the portions, eliminating all of the books in the list except the one with the best cost benefit.

4. The computer program product as recited in claim 3, wherein the portions and the books are represented by Boolean functions.

5. The computer program product as recited in claim 3, wherein the selecting program step further comprises the program step of regenerating the list after each substitution of one of the books for one of the portions.

6. The computer program product as recited in claim 5, wherein the portions lie along a critical path through the logic circuitry.

7. A method for redesigning dynamic logic circuitry, comprising the steps of:

removing inverting nodes from portions of the logic circuitry so that the portions only comprise AND and OR books;

comparing portions of the logic circuitry to a library of books;

building a list of matches between the portions of the logic circuitry and the library of books; and selecting the matches that provide a specified cost benefit, wherein selected ones of the matches have a higher cost benefit.

8. A data processing system for redesigning logic circuitry, comprising:

circuitry for removing inverting nodes from portions of the logic circuitry so that the portions only comprise AND and OR books;

circuitry for comparing portions of the logic circuitry to a library of books;

circuitry for building a list of matches between the portions of the logic circuitry and the library of books; and circuitry for selecting the matches that provide a specified cost benefit, wherein selected ones of the matches have a higher cost benefit.

* * * * *

UNITED STATES PATENT AND TRADEMARK OFFICE
CERTIFICATE OF CORRECTION

PATENT NO. : 6,460,166 B1
DATED : October 1, 2002
INVENTOR(S) : Lakshmi Narasimha Reddy and Thomas Edward Rosser It is certified that error appears in the above-identified patent and that said Letters Patent is hereby corrected as shown below:

Column 1,
Line 9, please replace "identifying" with -- Identifying --.

Column 4,
Line 21, after "primitive" please delete -- . --.

Signed and Sealed this

Twenty-fifth Day of February, 2003

JAMES E. ROGAN
*Director of the United States Patent and Trademark Office*